United States Patent
Kirschbauer et al.

[11] Patent Number: 5,917,705
[45] Date of Patent: *Jun. 29, 1999

[54] CHIP CARD

[75] Inventors: Josef Kirschbauer, Blaibach; Erich Hopf, Köfering; Günther Grönninger, Seubersdorf; Jürgen Fischer, Deuerling; Günter Didschies, Nürnberg; Josef Mundigl, Nittendorf; Michael Rogalli, Rottenburg, all of Germany

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/740,149

[22] Filed: Oct. 28, 1996

Related U.S. Application Data

[63] Continuation of application No. PCT/DE95/00312, Mar. 7, 1995.

[30] Foreign Application Priority Data

Apr. 27, 1994 [DE] Germany ............... 44 14 731
Nov. 24, 1994 [DE] Germany ............... 44 41 931

[51] Int. Cl.$^6$ ...................................... H05K 1/14
[52] U.S. Cl. ................. 361/737; 361/742; 257/679
[58] Field of Search ................... 361/736, 737, 361/740, 741, 742, 745, 747–749, 752–754, 756, 758–759, 770, 801–803, 820; 235/380, 492, 441, 435, 487; 264/272.11, 272.14, 274, 275; 257/679; 439/892

[56] References Cited

FOREIGN PATENT DOCUMENTS 0 344 058  11/1989  European Pat. Off. .
0 254 640  10/1991  European Pat. Off. .
0 456 323  11/1991  European Pat. Off. .
0 527 438   2/1993  European Pat. Off. .

OTHER PUBLICATIONS

Patent Abstract of Japan, vol. 14, No. 469 (M–1034) Oct. 12, 1990; & JP–A–2188298 (Megumi) Jul. 24, 1990.

*Primary Examiner*—Leo P. Picard
*Assistant Examiner*—Phuong T. Vu
*Attorney, Agent, or Firm*—Herbert L. Lerner; Laurence A. Greenberg

[57] ABSTRACT

A chip card includes a plastic card. A plastic body is disposed in the plastic card and a semiconductor chip is surrounded by the plastic body. Contact strips are electrically connected with the semiconductor chip and are connected to the plastic card. The contact strips have a flexible region near and outside of the plastic body and are advantageously parts of a lead frame. An adhesive which joins the contact strips to the plastic card has at least three layers including a middle layer of flexible material.

6 Claims, 1 Drawing Sheet

CHIP CARD

CROSS-REFERENCE TO RELATED APPLICATION

This application is a Continuation of International Application Ser. No. PCT/DE95/00312, filed Mar. 7, 1995.

BACKGROUND OF THE INVENTION

Field of the Invention

The invention relates to a chip card including a plastic card, a semiconductor chip that is disposed in the plastic card, and contact strips which are electrically connected to the semiconductor chip and are joined to the plastic card.

One such chip card is known from European Patent 0 254 640 B1. In that known chip card, the contact strips are part of a lead frame. The semiconductor chip is disposed in the middle of the lead frame and is joined to the contact strips through the use of bonding wires. The semiconductor chip and the bonding wires are surrounded by a protective plastic composition, from which the contact strips protrude. The contact strips are joined to the plastic card in such a way that pointed securing tips of the plastic card which protrude into securing holes of the contact strips are thermally deformed so that the contact strips are retained. The plastic composition that protects the semiconductor chip fills up the entire space between the semiconductor chip and the plastic card and also acts as an additional securing device for the contact strips.

However, chip cards are also known in which the contact strips are constructed as a copper laminate on a plastic film. The contact strips are then joined to the plastic card by the plastic film.

In everyday use, chip cards are exposed to considerable bending strain and for that reason have to pass stringent tests. Therefore, even after being bent a great number of times, the chip must not be destroyed, nor may the bonding wires tear off, nor can the contact strips detach from the plastic card. In the known chip card, although the danger of detachment of the contact strips from the plastic card is slight because of the special way in which the contact strips are secured, nevertheless the danger that the contact strips will tear off under severe bending conditions is very high as a result of such securing.

In chip cards in which the contact strips are laminated on the plastic film and form a substrate module as well, the danger that large-area, rigid modules will break is very high.

SUMMARY OF THE INVENTION

It is accordingly an object of the invention to provide a chip card, which overcomes the hereinafore-mentioned disadvantages of the heretofore-known devices of this general type and in which the danger that contact strips will tear off or a substrate module will break is averted, without causing detachment of the contact strips from the plastic card.

With the foregoing and other objects in view there is provided, in accordance with the invention, a chip card, comprising a plastic card; a plastic body disposed in the plastic card; a semiconductor chip surrounded by the plastic body; contact strips electrically connected with the semiconductor chip and connected to the plastic card, the contact strips having a flexible region, near and outside of the plastic body; and an adhesive joining the contact strips to the plastic card, the adhesive having at least three layers including a middle layer of flexible material.

This type of connection according to the invention between the contact strips and the plastic card has the advantage that when the chip card is subjected to bending strain, the middle, flexible layer of the adhesive can yield, and thus despite a firm connection between the plastic card and the contact strips, the danger that the contact strips will tear off is eliminated.

The chip is surrounded by the plastic body in order to protect the semiconductor chip and in particular the bonding wires that electrically connect it to the contact strips. To that end, it is advantageously integrally cast with the aid of a casting mold.

The contact strips have the flexible region near the plastic body in order to further improve the bending load capacity of the chip card.

In accordance with another feature of the invention, the flexible region is an expansion bead or a thin web of meandering course. It is especially advantageous if, for instance, at least one thin, short web of expandable material forms the flexible region.

In accordance with a further feature of the invention, peripheral layers of the adhesive are formed by hot-melt adhesive. This has the advantage of ensuring that at room temperature the adhesive is in a solid aggregate state and is thus easy to handle, and, for instance, can be made available in the form of tape or as a pre-punched preform.

In accordance with an added feature of the invention, the peripheral layers of the adhesive are adapted in their adhesive properties to the materials to be joined, such as metal and plastic.

In accordance with an additional feature of the invention, the contact strips are part of a lead frame, that is a set of conductors which initially cohere through a frame and are separated from one another by being punched out of the frame. As compared with currently conventional copper-laminated plastic substrates, such a lead frame has the advantage of substantially lower cost.

In accordance with a concomitant feature of the invention, the dimensions of the recess in the plastic card and of the plastic body are such that the plastic body has no direct contact with the plastic card even when the card is bent, or in other words it is floatingly suspended through the use of the contact strips. As a result, neither the chip nor the plastic body can be destroyed by the imposition of pressure. The recess should be constructed in such a way that even if the card is bent, no pressure is exerted on the contact strips, for instance by one edge of the recess.

Other features which are considered as characteristic for the invention are set forth in the appended claims.

Although the invention is illustrated and described herein as embodied in a chip card, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
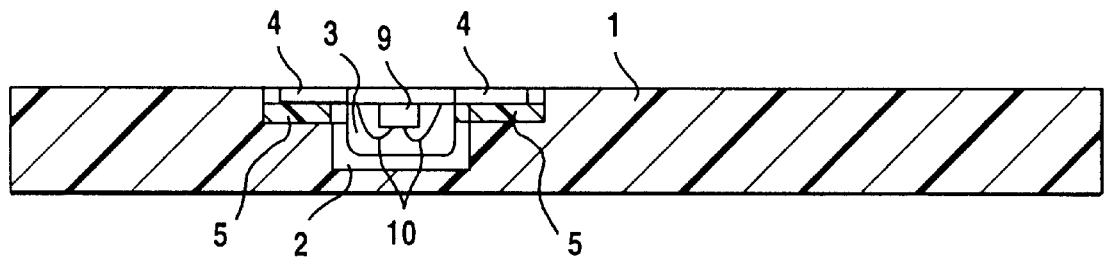
FIG. 1 is a diagrammatic, cross-sectional view of a chip card.

Referring now to the figures of the drawings in detail and first, particularly, to FIG. 1 thereof, there is seen a chip card, in which a chip card module is placed in a card pocket 2 of a plastic card 1. The chip card module includes a synthetic or plastic body 3, on which a plurality of contact strips 4 are disposed. A semiconductor chip 9 which is located in the plastic body 3 is electrically connected to the contact strips 4 through the use of bonding wires 10.

The production of such a chip card module is typically accomplished in such a way that the semiconductor chip 9 is glued to a lead frame surrounding the contact strips 4 and is then electrically connected to the contact strips 4 through the use of the bonding wires. The semiconductor chip 9 and the bonding wires 10 are then cast integrally in the plastic or are spray-coated with plastic. The plastic body 3 with the contact strips 4 thus secured to it is then punched out of the frame and, in the manner according to the invention, glued into the card pocket 2 of the plastic card 1 through the use of a multilayer adhesive 5. The multilayer adhesive 5 has a middle flexible layer which, under bending load of the plastic card 1, is intended to reduce transmission of force from the plastic card 1 to the contact strips 4, so that the contact strips 4 will not tear off.

The adhesive 5 is preferably made up of three layers, in which the middle flexible layer may, for instance, be formed of foamed polyethylene or polymethane. It is preferably 40 $\mu$m thick. On each of two sides of this flexible layer, there is a preferably 20 $\mu$m thick adhesive layer, for which hot-melt adhesives are advantageously used, since they have a solid aggregate state at room temperature and thus are easily handled. For instance, hot-melt adhesives such as styrene-isoprene-styrene block copolymer or styrene-butadiene styrene block copolymer, or hot-melt adhesives such as polyamides or polymethanes may be used.

These adhesives can be in the form of tape, for instance. Preforms adapted to the card pocket 2 of the plastic card and to the dimensions of the chip card module can be punched out from such a tape and then glued into the card pocket 2 through the use of a heated forming die. Then the chip card module is glued in place as well, again using a heated die.

Although it is also possible to already stick the adhesive tape onto the lead frame, then recesses have to be punched out beforehand for the plastic body. The adhesive tape can then be punched out of the lead frame, together with the chip card module.

Figure 2:
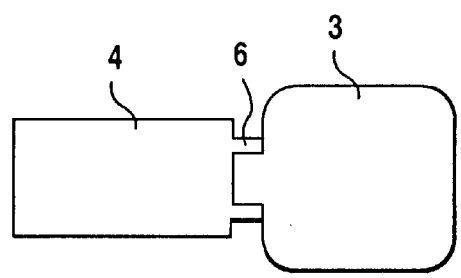
FIG. 2 is a plan view of a chip card module.
Figure 3:
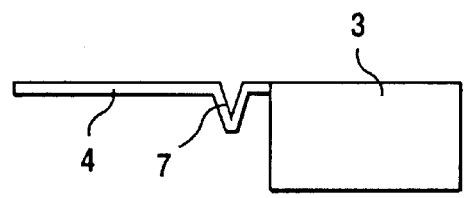
FIG. 3 is a side-elevational view of a chip card module.
Figure 4:
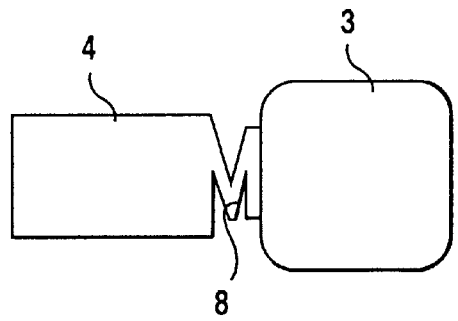
FIG. 4 is a plan view of a chip card module.

In order to further reduce the danger that the contact strips 4 will tear off, a flexible region can be provided on the contact strips 4, next to the plastic body 3. FIGS. 2, 3 and 4 show examples of how these flexible regions can be constructed. The plan view of a chip card module of FIG. 2 shows a plastic body 3 with only one contact strip 4, which is joined to the plastic body 3, and thus to the semiconductor chip located in it, through two thin webs 6. The contact strip 4 and the webs 6 are of expandable material, and thus these webs absorb a certain tensile strain that occurs in response to a bending load of the chip card. Normally, there are either six or eight contact strips 4 for one chip card module. The contact strips 4 are disposed on two sides of the chip card module and the danger of tearing off is great, especially for the outermost contact strips. However, only one contact strip is shown in the drawing for the sake of simplicity.

The side view of a chip card module of FIG. 3 shows a region of the contact strip 4 formed by an expansion bead 7. In the plan view of a chip card module of FIG. 4, a thin, meandering-shape web 8 is shown, which joins the contact strip 4 to the plastic body 3.

We claim:

1. A chip card, comprising:
   a plastic card;
   a plastic body disposed in said plastic card;
   a semiconductor chip surrounded by said plastic body;
   a metallic lead frame having metallic contact strips electrically connected with said semiconductor chip and connected to said plastic card, said contact strips having a contact region and a metallic flexible region, said metallic flexible region disposed between said contact region and said plastic body and absorbing tensile strains to improve the bending load capacity of the chip card; and
   an adhesive joining said contact strips to said plastic card, said adhesive having at least three layers including a middle layer of flexible material, said metallic flexible region and said adhesive being spaced apart from each other.

2. The chip card according to claim 1, wherein said metallic flexible region includes an expansion bead.

3. The chip card according to claim 1, wherein said metallic flexible region includes at least one thin web of expandable material.

4. The chip card according to claim 1, wherein said metallic flexible region includes a meandering thin web.

5. The chip card according to claim 1, wherein said adhesive includes peripheral layers of hot-melt adhesives.

6. The chip card according to claim 1, wherein said plastic body has no direct contact with said plastic card.

* * * * *